United States Patent [19]

Stemmler et al.

[11] Patent Number: 4,525,389
[45] Date of Patent: Jun. 25, 1985

[54] METHOD FOR CONVEYING AND TREATING A GAS EMPLOYED FOR THE COATING OF WORKPIECES BY MEANS OF A CHEMICAL, HETEROGENEOUS VAPOR-PHASE REACTION

[75] Inventors: Bruno Stemmler, Karlsfeld; Hans Zeilinger, Puchheim, both of Fed. Rep. of Germany

[73] Assignee: Aktiengesellschaft M.A.N. Maschinenfabrik Augsburg-Nurnberg, Munich, Fed. Rep. of Germany

[21] Appl. No.: 560,741

[22] Filed: Dec. 12, 1983

[30] Foreign Application Priority Data

Dec. 11, 1982 [DE] Fed. Rep. of Germany ....... 3245900
Oct. 26, 1983 [DE] Fed. Rep. of Germany ....... 3338852

[51] Int. Cl.³ .................... C23C 11/00; C23C 13/00
[52] U.S. Cl. ................. 427/255.1; 427/249; 427/255.2; 427/255.3; 427/345
[58] Field of Search ............... 427/255.3, 255.2, 345, 427/8, 248.1, 249, 250, 255.1

[56] References Cited

U.S. PATENT DOCUMENTS

| 2,543,710 | 3/1951 | Schmidt et al. | 148/6.35 |
| 3,306,768 | 2/1967 | Peterson | 427/255.3 |
| 3,540,919 | 11/1970 | Bracken | 427/345 |
| 3,684,585 | 8/1972 | Stroup et al. | 148/6.35 |
| 3,956,532 | 5/1976 | Russell | 427/345 |

FOREIGN PATENT DOCUMENTS 2437876 2/1975 Fed. Rep. of Germany ...... 427/327

Primary Examiner—Sadie L. Childs
Attorney, Agent, or Firm—Scully, Scott, Murphy & Presser

[57] ABSTRACT

A process is disclosed comprising a method for treating and conveying gas mixtures in a coating process employing a chemical, heterogeneous vapor-phase reaction in a reaction chamber in which the reaction product obtained in the reaction chamber is withdrawn from the reaction chamber, separated into at least one component, the withdrawn component is dosed and reintroduced into the reaction chamber.

9 Claims, 3 Drawing Figures

METHOD FOR CONVEYING AND TREATING A GAS EMPLOYED FOR THE COATING OF WORKPIECES BY MEANS OF A CHEMICAL, HETEROGENEOUS VAPOR-PHASE REACTION

BACKGROUND OF THE INVENTION

1. Field of the Invention

The present invention relates to a method and to an apparatus for coating workpieces through the intermediary of a chemical, heterogeneous vapor-phase reaction in a dynamic process, in which reactants are introduced into a reaction chamber, and a gas or gas-vapor mixture is withdrawn from the reaction chamber.

2. Discussion of the Prior Art

Currently known prior art methods which relate to coating processes through separation from the vapor phase employ static and dynamic processes. The static method; for example as disclosed in German Laid-open Patent Application No. 24 37 876 merely describes positioning the workpiece which is to be coated in a hermetically-sealed reaction atmosphere under a definite temperature. The composition as defined by the reaction atmosphere is hereby provided either once in the quantity which is required to form the coating, or supplied repeatedly at predetermined intervals. Although this process is carried out in proximity to the reaction equilibrium which is required for the separation, it necessitates a relatively lengthy reaction period and, at best, is suitable only for small workpieces.

When employing the principle of the dynamic method, such as described, for example, in U.S. Pat. No. 3,684,585, the gas-vapor mixture which is required for the coating is introduced in a suitable concentration into a reaction furnace containing the workpiece which is to be coated. Therein, the mixture reacts with the surface of the workpiece, and exits into the environment with a correspondingly changed composition. In this process there is achieved a much shorter reaction period than with the static method. In order to produce qualitatively good coatings, through suitable monitoring of the addition of reactants to the process there must be achieved the reaction equilibrium process, which necessitates extensive control requirements. Moreover, the dynamic process requires a relatively high consumption of material.

SUMMARY OF THE INVENTION

Accordingly, it is a basic object of the present invention to provide an improved process of the above-described type which will enable the formation of reproducible coatings in a simple manner.

It is a more specific object of the present invention to provide a process of the above-described type for the coating of workpieces through the employment of a chemical, heterogeneous vapor-phase reaction, in which one component of the reaction product is reconveyed, at least partially, to the reaction for at least a part of the process period.

It has been ascertained that, as a result the reconveyance of reaction products into the reaction process, there is obtained a natural adjustment of the concentration of the process atmosphere at which the decomposition and the formation of reaction products stand in approach to equilibrium. This renders possible a process approaching a reaction equilibrium over the entire duration of the process without requiring precise knowledge over the prevailing equilibrium condition. In this manner, it is possible to develop a process enabling the formation of reproducible layers of universal applicability with relatively little effort expended, also in successive processes.

Preferably, pursuant to the present invention, the dosing of the reconveyed component of components from the reaction product into the reaction chamber is effectuated in conformance with the progress of the reaction and, as required, is supplemented or replaced for a part of the time through a change in the temperature within the reaction chamber.

The reaction potential $P_r$, which affects the reaction rate and which can be varied over time, is a function of the temperature $T(t)$ and mass flow $\dot{m}(t)$, thus: $P_r(t) = f(T, \dot{m})$. Thus, through dosing of the reactants and/or controlling the temperature the reaction rate can be controlled such that the reaction can be controlled such that the reaction can be adjusted in conformance with the necessary chemical composition and coating matrix, the infeed of the reactants is hereby effected as a function of the partial pressure of the components which are to be reconveyed, which function can be calculated through an e-function $P_r \sim e^{-\dot{E}t/V}$ based on the supply/consumption ratio; wherein E is the feed current, V the container volume, and t the reaction time.

Hereby, pursuant to a further feature of the present invention, a predetermined quantity of reactants can be introduced into the reaction chamber at the beginning of the reaction, and the temperature continually raised until the reaction potential $P_r$ reaches a value at which there sets in a nucleation of the layer on the substrate or workpiece. Through controlled determination of the reaction potential, there can be advantageously influenced the morphology of the prime layer and, thereby the bonding of the coating.

The identical effect can be obtained when, instead of changing the temperature, there is increased the mass flow of the reactants, of when both parameters are concurrently raised.

According to another aspect of the present invention, the reaction potential of the reactant can be slightly lowered, upon the activation energy having been reached through lowering of the temperature and/or a change in the reaction flow, so as to cause layer growth to follow as closely as possible to the chemical equilibrium and to thereby obtain a defined, homogeneous structure.

A particularly advantageous feature of the present invention is achieved when the reaction potential of the reactant is lowered through admixing with the reconveyed component or components from the reaction product. Determined hereby was the fact that this imparted to the separation process a relatively large degree of freedom over the process conditions, such as temperature, pressure, flow velocity, dosing of the gas-/vapor composition and quantity in correlation with the progress of reaction.

Consequently, in comparison with conventional processes, the inventive process will result in savings of energy and reactants.

The process of the present invention is universally applicable to the production of defined metallic and nonmetallic layers or coatings, such as, for example, chromium, aluminum, titanium, silicon or oxides, nitrides, carbides. Successive processes can be contiguously effected, for instance, without the need of removing the workpiece between processes.

BRIEF DESCRIPTION OF THE DRAWINGS

The present invention is now described in greater detail in connection with an exemplary embodiment, having reference to the accompanying drawings; in which.

DETAILED DESCRIPTION

For the production of a $CR_2O_3$ layer or coating on a chrome-containing alloy, the workpiece 10 which is to be coated is arranged in a reaction furnace 11 which has been brought to and maintained at the necessary coating temperature under an inert gas atmosphere or hydrogen.

After the workpiece 10 has been heated to a predetermined temperature, steam or a steam-hydrogen mixture is introduced as a reactant into a carrier gas, such as argon, into the reactor 11 through a supply line 12. Within the reactor, the reactant reacts selectively with the surface 13 of the workpiece after overcoming the activation threshold, pursuant to the following reaction equation:

$$2Cr + 3H_2O \rightleftharpoons Cr_2O_3 + 3H_2.$$

The reaction will cause a $Cr_2O_3$ layer or coating to form on the surface 13 of the workpiece.

Figure 3:
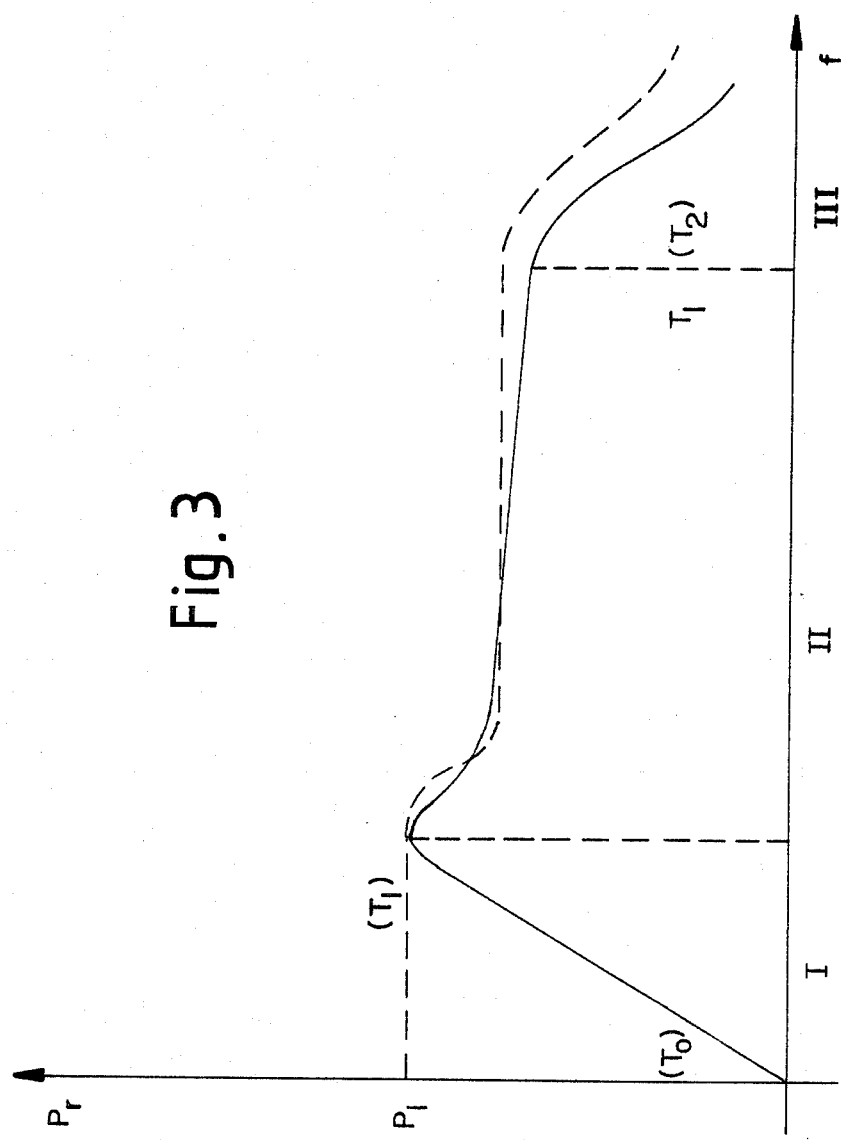
FIG. 3 a graphical time plot of the inventive reaction.

The activation threshold can also be reached by continually raising the temperature T at a predetermined quantity of reactants, so as to raise the reaction potential $P_r$, as set forth in the graph in FIG. 3 until, for example, the activation threshold is reached at $P_1$.

When the activation energy has been reached, nucleation commences on the surface 13 of the substrate. Through selection of the heat input and/or of the mass flow during the starting phase, shown in FIG. 3, nucleation can be sufficiently influenced so as to render it homogeneous for an implaced prime layer, and to impart it good bonding to the substrate or workpiece.

After commencement of nucleation, (Phase II, FIG. 3), the reaction potential $P_r$ is lowered for the layer growth in order to achieve a controlled, homogeneous growth of the basic structure of the prime layer. This is achieved through the following measures:

At the outlet 15, the unreacted steam and the hydrogen which is obtained as a reaction product exit in an amount which is stoichiometrically equivalent to the amount of oxygen which has bonded to the surface 13 of the workpiece. The reaction product is reconveyed through lines 16 and 17 into the reactor 11 so as to retard the further reaction, as discussed below. During the same time, fresh live steam can be introduced through line 12, and therefore an equivalent amount of gas-steam mixture exhausted to the environment through a valve 18. The reaction potential assumes the profile plotted in solid line in FIG. 3. The phantom line represents a conventional dynamic process.

At predetermined quantity ratios of the components which take part in the reaction, a reaction equilibrium will be reached in which the decomposition of one or several components equals the formation of other components. This equilibrium can be expressed for the illustrative example as described herein on the basis of the partial pressures of the various components, as follows:

$$\frac{a_{Cr_2O_3} \times P^3_{H_2}}{a_{Cr} \times P^3_{H_2O}} = K_p;$$

wherein $K_p$ represents the thermodynamic equilibrium constant which, for a predetermined reaction, will be solely dependent upon the temperature.

At a pregiven partial chrome activity pressure $a_{Cr}$, which depends upon the workpiece 10, and a given partial steam pressure $P_{H_2}$ the activity of the oxide $a_{Cr_2O_3}$ will adapt itself to the amount of hydrogen present. To the extent of which the process will then approach the above-mentioned equilibrium depends upon the potential ratios and further reaction properties whereby, for example, the diffusion rate of chrome will also be a factor.

In this respect, the reconveyance of the hydrogen into reactor 11 plays a decisive role, inasmuch as through the hydrogen there can be created the requisite balance, and thereby the reaction process brought near to equilibrium, leading to a largely unflawed structure of the layer 13. The increase in the hydrogen proportion of the reaction atmosphere provided by the reconveyance concurrently affords the advantage in that it selectively lowers the oxidation potential of the incoming fresh live steam so as to obtain a desired structure for the layer. These advantages can be achieved without the need for an additional hydrogen supply.

In the case wherein the quantity of the resulting reaction products exceeds a desired return quantity, the excess can be withdrawn from the circuit 15, 16, 17 through a control valve 18, with the valve 18 being suitably controlled as a function of the partial pressure of the reaction product or products. However, it is also possible, as described in the example hereinabove, to determine the fresh reactants as a function of the reaction products which are to be reconveyed, after the formation of the coating has been summarily determined by the potential ratio of the reactant and of the gaseous reaction product which, in the abovementioned example, is the coefficient $$P^3_{H_2}/P^3_{H_2O}$$

The inventive method does not necessarily require the use of a reactor furnace. In contrast thereto, the reaction atmosphere can be built up directly in the workpiece, when the configuration of the workpiece allows this, such as, for example, in the internal coating of pipes. Herein, it is of assistance to heat the workpiece which is to be coated up to the necessary temperature, employing a hot inert gas.

For example, when a chrome oxide layer is to be applied to a material devoid of or low in chrome, or when in the above process there is to be prevented any chrome depletion below the oxide layer resulting from the coating process, the same apparatus can be employed in a preliminary process to raise the chrome content, in which a thermally decomposable volatile liquid or gaseous chrome compound is conveyed into the reactor 11 together with a carrier gas, so as to form a metallic chrome surface on the workpiece which can diffuse into the material 10. When a reconveyance of reaction products should not be necessary or desirable for this purpose they can be completely withdrawn from the cycle through valve 18. The preliminary process is then followed by the coating process, as described hereinabove, without the necessity of modifying the apparatus or to remove the workpiece 10 from the reactor 11.

In a similar manner, it is also possible through "zone alloying" as well as through coating with other elements, such as Al, Si, Ti, B and subsequent processes, to form oxides, nitrides or carbides.

When required, other operating units can be connected into the reacton product return cycle in order to influence the flow of fluid.

Figure 1:
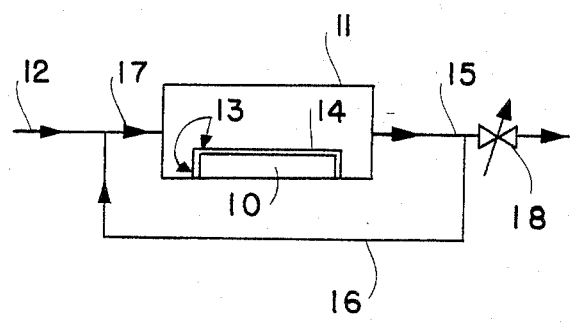
FIG. 1 illustrates a generally schematic representation of an arrangement for the coating of workpieces through a chemical, heterogeneous vapor-phase reaction.
Figure 2:
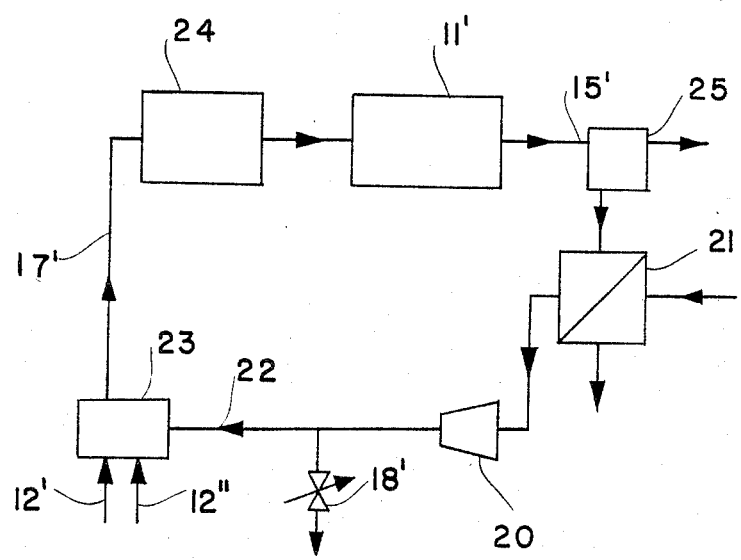
FIG. 2 illustrates a block diagram of a modified arrangement for the coating of workpieces pursuant to the invention.

FIG. 2 represents an apparatus embodiment in which the reaction products exiting from the reactor 11' through the outlet line 15' are circulated by means of a circulation compressor 20, with the compressor 20 being a cooler 21 connected ahead thereof. Arranged at the outlet end of the compressor 20 is a mixer in which the reaction products flowing in through line 22 are admixed with fresh reactants 12' and 12", and are then conveyed into the reactor 11' through a line 17' and a preheater.

For processes in which it is desirable to reconvey only a few components of the reaction products, there is provided a separator 25. This will ensure that no environmentally injurious substances escape into the environment.

It is also possible to provide a regulatable valve 18' in the return cycle so as to be additionally able to control the quantity of gas mixture which is to be reconveyed.

What is claimed is:

1. A method for treating and conveying gas mixtures in a coating process through a chemical, heterogeneous vapor-phase reaction in a reaction chamber comprising the steps of:
   (a) introducing reactants into said reaction chamber;
   (b) extracting the reaction product from said reaction chamber;
   (c) separating at least one component of the said extracted reaction product;
   (d) dosing said component or components in correlation with said reaction and
   (e) reconveying said dosed component or components into said reaction chamber over at least part of the time in which said coating process is carried out.

2. Method as claimed in claim 1, comprising introducing a predetermined quantity of reactant into the reaction chamber at the start of the reaction; and continually raising the temperature in said chamber.

3. Method as claimed in claim 1, comprising increasing the mass flow of the reactant or reactants at a given temperature at the start of the reaction.

4. Method as claimed in claim 2, comprising lowering the temperature and varying the flow of reactant so as to reduce the reaction potential of the reactant or reactants upon reaching of the activation energy.

5. Method as claimed in claim 4, comprising reducing the reaction potential of the reactant or reactants by admixing with the component or components reconveyed from the reaction product.

6. Method as claimed in claim 5, comprising admixing at least one reactant with the reconveyed component or components.

7. Method as claimed in claim 6, comprising controlling the concentration of the reconveyed component or components through the infeed of said reactant or reactants.

8. Method as claimed in claim 7, comprising regulating the infeed of the reactant or reactants as a function of the partial pressure of the reconveyed components.

9. Method as claimed in claim 1, comprising the utilization of steam oxidation; including returning hydrogen and residual steam from the reaction, and introducing live steam as a function of the partial hydrogen pressure.

* * * * *